United States Patent
Song et al.

(10) Patent No.: US 10,884,555 B2
(45) Date of Patent: Jan. 5, 2021

(54) CONDUCTIVE PATTERN

(71) Applicant: DONGWOO FINE-CHEM CO., LTD., Iksan-si (KR)

(72) Inventors: Byung Hoon Song, Gunpo-si (KR); Dong Ki Keum, Daejeon (KR); Dae Chul Park, Seoul (KR); Sun Young Song, Incheon (KR); Hwansil Jang, Hwaseong-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 2 days.

(21) Appl. No.: 15/550,019

(22) PCT Filed: Feb. 5, 2016

(86) PCT No.: PCT/KR2016/001315
§ 371 (c)(1),
(2) Date: Aug. 9, 2017

(87) PCT Pub. No.: WO2016/129898
PCT Pub. Date: Aug. 18, 2016

(65) Prior Publication Data
US 2018/0024671 A1  Jan. 25, 2018

(30) Foreign Application Priority Data
Feb. 10, 2015 (KR) .......... 10-2015-0019893

(51) Int. Cl.
*G06F 3/044* (2006.01)
*H05K 3/10* (2006.01)
(Continued)

(52) U.S. Cl.
CPC .............. *G06F 3/044* (2013.01); *H01B 1/02* (2013.01); *H01B 1/22* (2013.01); *H05K 3/103* (2013.01);
(Continued)

(58) Field of Classification Search
CPC ................ G06F 3/043; G06F 3/044; G06F 2203/04103; G06F 2203/04112;
(Continued)

(56) References Cited

U.S. PATENT DOCUMENTS 8,749,009 B2 * 6/2014 Young ............... H01L 31/0481
257/439
9,195,271 B2  11/2015 Kang et al.
(Continued)

FOREIGN PATENT DOCUMENTS

CN  101599316 A  12/2009
CN  101734646 A  6/2010
(Continued)

OTHER PUBLICATIONS

CN Office Action in Application No. 201680009596.9 dated Sep. 27, 2019.

*Primary Examiner* — Paresh H Paghadal
(74) *Attorney, Agent, or Firm* — Maschoff Brennan

(57) ABSTRACT

Provided is a conductive pattern having at least one unit conductive pattern forming one touch pixel according to an aspect of the present invention. The at least one unit conductive pattern includes a plurality of nanostructures each having opposite ends. A ratio of nanostructures, both opposite ends of which are in contact with edges of the at least one unit conductive pattern to all nanostructures included in the at least one unit conductive pattern is 70% or more.

6 Claims, 7 Drawing Sheets

(51) Int. Cl.
  *H01B 1/22* (2006.01)
  *H01B 1/02* (2006.01)
  *H05K 3/06* (2006.01)
  *H05K 3/12* (2006.01)
  *H05K 1/03* (2006.01)
  *H05K 1/02* (2006.01)

(52) U.S. Cl.
  CPC .... *G06F 2203/04103* (2013.01); *H05K 1/028* (2013.01); *H05K 1/0242* (2013.01); *H05K 1/0265* (2013.01); *H05K 1/0393* (2013.01); *H05K 3/06* (2013.01); *H05K 3/1241* (2013.01); *H05K 2201/026* (2013.01); *H05K 2201/0332* (2013.01); *H05K 2201/0364* (2013.01); *H05K 2201/09281* (2013.01); *H05K 2201/09727* (2013.01); *H05K 2201/10151* (2013.01); *H05K 2203/1105* (2013.01)

(58) Field of Classification Search
  CPC . H01B 1/02; H01B 1/22; H05K 1/028; H05K 1/0393; H05K 3/103; H05K 3/06; H05K 3/1241; H05K 2201/026; H05K 2201/09727; H05K 2201/10151; H05K 2203/1105
  See application file for complete search history.

(56) References Cited

U.S. PATENT DOCUMENTS

| | | | | |
|---|---|---|---|---|
| 9,793,423 B2* | 10/2017 | Kim | ............ | H01L 51/444 |
| 10,025,443 B2* | 7/2018 | Ando | ............ | G06F 3/044 |
| 10,088,931 B2* | 10/2018 | Kim | ............ | H01B 1/02 |
| 10,330,527 B2 | 6/2019 | Fiederling | ............ | F21S 41/14 |
| 2006/0257638 A1* | 11/2006 | Glatkowski | ............ | C09D 5/24 |
| | | | | 428/292.1 |
| 2006/0284537 A1* | 12/2006 | Tolt | ............ | H01J 1/304 |
| | | | | 313/306 |
| 2008/0143906 A1* | 6/2008 | Allemand | ............ | B82Y 10/00 |
| | | | | 349/43 |
| 2009/0061170 A1* | 3/2009 | Fujikawa | ............ | H05K 3/4038 |
| | | | | 428/195.1 |
| 2009/0305055 A1 | 12/2009 | Shimizu | | |
| 2010/0051332 A1* | 3/2010 | Tsai | ............ | B82Y 10/00 |
| | | | | 174/256 |
| 2010/0124646 A1 | 5/2010 | Jiang et al. | | |
| 2010/0214646 A1* | 8/2010 | Sugimoto | ............ | G02B 26/0841 |
| | | | | 359/292 |
| 2010/0243295 A1* | 9/2010 | Allemand | ............ | B82Y 10/00 |
| | | | | 174/250 |
| 2011/0030938 A1* | 2/2011 | Liu | ............ | F28F 21/02 |
| | | | | 165/185 |
| 2011/0039459 A1* | 2/2011 | Yancey | ............ | B82Y 10/00 |
| | | | | 439/884 |
| 2011/0089160 A1* | 4/2011 | Kuriki | ............ | G06F 3/044 |
| | | | | 219/553 |
| 2012/0183307 A1* | 7/2012 | Law | ............ | G03G 15/32 |
| | | | | 399/8 |
| 2012/0255762 A1 | 10/2012 | Katagiri et al. | | |
| 2013/0181944 A1* | 7/2013 | Lee | ............ | G06F 3/044 |
| | | | | 345/174 |
| 2014/0253827 A1* | 9/2014 | Gao | ............ | H05K 1/0298 |
| | | | | 349/12 |
| 2015/0185892 A1* | 7/2015 | Chae | ............ | G06F 3/041 |
| | | | | 345/173 |
| 2016/0024673 A1* | 1/2016 | Cornelius | ............ | B01J 19/0093 |
| | | | | 73/25.01 |
| 2016/0160758 A1* | 6/2016 | Marchaj | ............ | F02C 7/047 |
| | | | | 60/779 |
| 2017/0150598 A1* | 5/2017 | Jung | ............ | G06F 3/041 |
| 2017/0168608 A1* | 6/2017 | Kim | ............ | G06F 3/0412 |

FOREIGN PATENT DOCUMENTS

| | | |
|---|---|---|
| CN | 102087884 A | 6/2011 |
| CN | 102830879 A | 12/2012 |
| CN | 202838249 U | 3/2013 |
| EP | 2698689 A2 | 2/2014 |
| JP | 2011-086413 A | 4/2011 |
| JP | 2013-247063 A | 12/2013 |
| KR | 10-2014-0053628 A | 5/2014 |
| KR | 10-2014-0055351 A | 5/2014 |
| KR | 10-2014-0003217 A | 12/2014 |

* cited by examiner

CONDUCTIVE PATTERN

TECHNICAL FIELD

The present invention relates to a conductive pattern, and more particularly, to a conductive pattern capable of improving conductivity and preventing an electrical disconnection error from occurring due to cracks.

BACKGROUND ART

Recently, a touch panel has been applied to various electronic products, through which a user input is input by touching an image displayed on a display device with a finger or an input device such as a stylus.

Such touch panels may be largely divided into a resistive-film type touch panel and a capacitive touch panel. A touched position on the resistive-film type touch panel is detected as glass and an electrode are shorted by pressure applied by an input device. A touched position on the capacitive touch panel is detected by sensing a change in a capacitance between electrodes, caused when the touch pad is touched by a finger.

As the resistive-film type touch panel is repeatedly used, the performance of the touch panel may be lowered and the touch panel may be scratched. Thus, much attention has been paid to capacitive touch panels having high durability and long lifetime.

The capacitive touch panel is defined as having an effective region into which a touch command may be input and an ineffective region outside the effective region. In the effective region, an electrode pattern is formed of a transparent conductive material to transmit light from a display device.

Conventionally, the electrode pattern is formed of an indium-tin oxide (ITO). The ITO is limited in terms of a high sheet resistance, high manufacturing costs, and imbalance between the supply and demand of indium in a raw material market. Furthermore, the ITO is not available for a flexible display apparatus which is a recent trend.

Recently, research has been conducted on a transparent electrode material such as silver nanowire which may replace the ITO.

FIG. 1 is a diagram illustrating a transparent electrode formed of conventional silver nanowires.

Referring to FIG. 1, a conventional transparent conductive sheet A includes silver nanowires NW. The silver nanowires NW are limited in terms of an aspect ratio and are manufactured having a small diameter of about 100 nm to achieve high transmissivity. Thus, the silver nanowires NW having a relatively small length of 5 um to 10 um are applied to a transparent conductive sheet A.

A transparent electrode B is formed by patterning the transparent conductive sheet A according to a certain width. The transparent electrode B includes a plurality of silver nanowires NW. The silver nanowires NW of the transparent electrode B are short and thus many disconnections occur between the silver nanowires NW, thereby lowering conductivity.

Furthermore, the transparent electrode B is disadvantageous in that it may be electrically open due to cracks occurring due to external shocks.

DISCLOSURE

Technical Problem

The present invention is directed to a conductive pattern capable of improving conductivity while maintaining optical transmissivity.

The present invention is also directed to a conductive pattern capable of reducing manufacturing costs.

The present invention is also directed to a conductive pattern capable of preventing cracks from occurring and preventing electrical disconnection from occurring even when cracks occur, Aspects of the present invention are not limited thereto, and additional aspects will be apparent to those of ordinary skill in the art from the following description and the appended drawings.

Technical Solution

One aspect of the present invention provides a conductive pattern having at least one unit conductive pattern forming one touch pixel. The at least one unit conductive pattern includes a plurality of nanostructures each having opposite ends. A ratio of nanostructures, both opposite ends of which are in contact with edges of the at least one unit conductive pattern to all nanostructures included in the at least one unit conductive pattern is 70% or more.

Advantageous Effects

According to the present invention, a ratio of nanostructures, opposite ends of which intersect side surfaces of a conductive pattern to all nanostructures of the conductive pattern may be set to be high so as to increase the number of intersection regions between the nanostructures, thereby increasing conductivity.

According to the present invention, intersecting nanostructures of the conductive pattern may be electrically connected to each other during removing of a polymer. Accordingly, an additional process may be skipped and thus manufacturing costs may be reduced.

According to the present invention, a ratio of nanostructures, opposite ends of which intersect side surfaces of connection parts to nanostructures of the connection parts in which cracks are likely to occur may be set to be high. Thus, the occurrence of cracks may be reduced, and an electrical disconnection error may be prevented from occurring even when cracks occur.

Effects of the present invention are not, however, limited thereto, and additional effects will be apparent to those of ordinary skill in the art from the following description and the appended drawings.

MODES OF THE INVENTION

Figure 1:
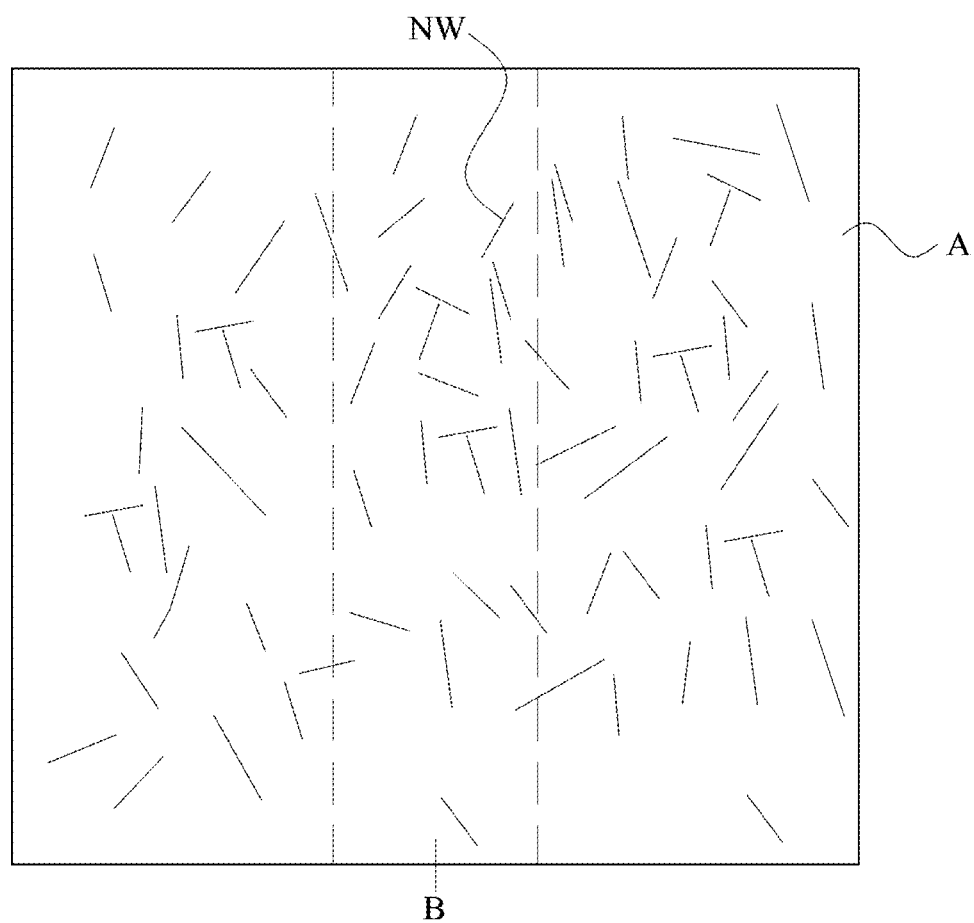
FIG. 1 is a diagram illustrating a transparent electrode formed of conventional silver nanowires.

Embodiments set forth herein are provided to clearly explain the idea of the present invention to those of ordinary skill in the technical field to which the invention pertains. Thus, the present invention is not limited by these embodiments. The scope of the present invention should be understood to include changed examples or modified examples which fall within the idea of the present invention.

In the present disclosure, general terms that have been widely used nowadays are selected, if possible, in consideration of functions of the present invention, but non-general terms may be selected according to the intentions of those of ordinary skill in the art, precedents, or new technologies, etc. Also, some terms may be arbitrarily chosen by the present applicant. In this case, the meanings of these terms will be explained in corresponding parts of the present disclosure in detail. Thus, the terms used herein should be defined not based on the names thereof but based on the meanings thereof and the whole context of the present invention.

The appended drawings are provided to easily explain the present invention, in which the shape of each of elements may be exaggerated for clarity. Thus, the present invention should not be construed as being limited thereby.

In the following description, well-known functions or constructions are not described in detail if it is determined that they would obscure the invention due to unnecessary detail.

A conductive pattern having at least one unit conductive pattern forming one touch pixel according to an aspect of the present invention is provided. The at least one unit conductive pattern includes a plurality of nanostructures each having opposite ends. A ratio of nanostructures, both opposite ends of which are in contact with edges of the at least one unit conductive pattern to all the nanostructures included in the at least one unit conductive pattern is 70% or more.

The conductive pattern may include connection parts connecting adjacent unit conductive patterns among the at least one unit conductive pattern. A ratio of nanostructures, both opposite ends of which are in contact with edges of the connection parts to all the nanostructures included in the connection parts may be different from that of the nanostructures, both opposite ends of which are in contact with the edges of the at least one unit conductive pattern to all the nanostructures included in the at least one unit conductive pattern.

The ratio of the nanostructures, both opposite ends of which are in contact with the edges of the connection parts to all the nanostructures included in the connection parts may be 80% or more.

A width of the connection parts may be 50% to 60% of that of the at least one unit conductive pattern.

The nanostructures may include a silver (Ag) material.

The nanostructures may be formed by electro-spinning.

The conductive pattern may include a matrix having the plurality of nanostructures.

The ends of the nanostructures which are in contact with the edges of the at least one unit conductive pattern may be exposed to the outside of the matrix.

The matrix may include a conductive material.

The matrix may prevent the plurality of nanostructures from being oxidized.

The nanostructures, both opposite ends of which are in contact with the edges of the at least one unit conductive pattern may intersect a straight line connecting the opposite ends at at least one point.

A conductive pattern according to an embodiment of the present invention will be described below.

Figure 2:
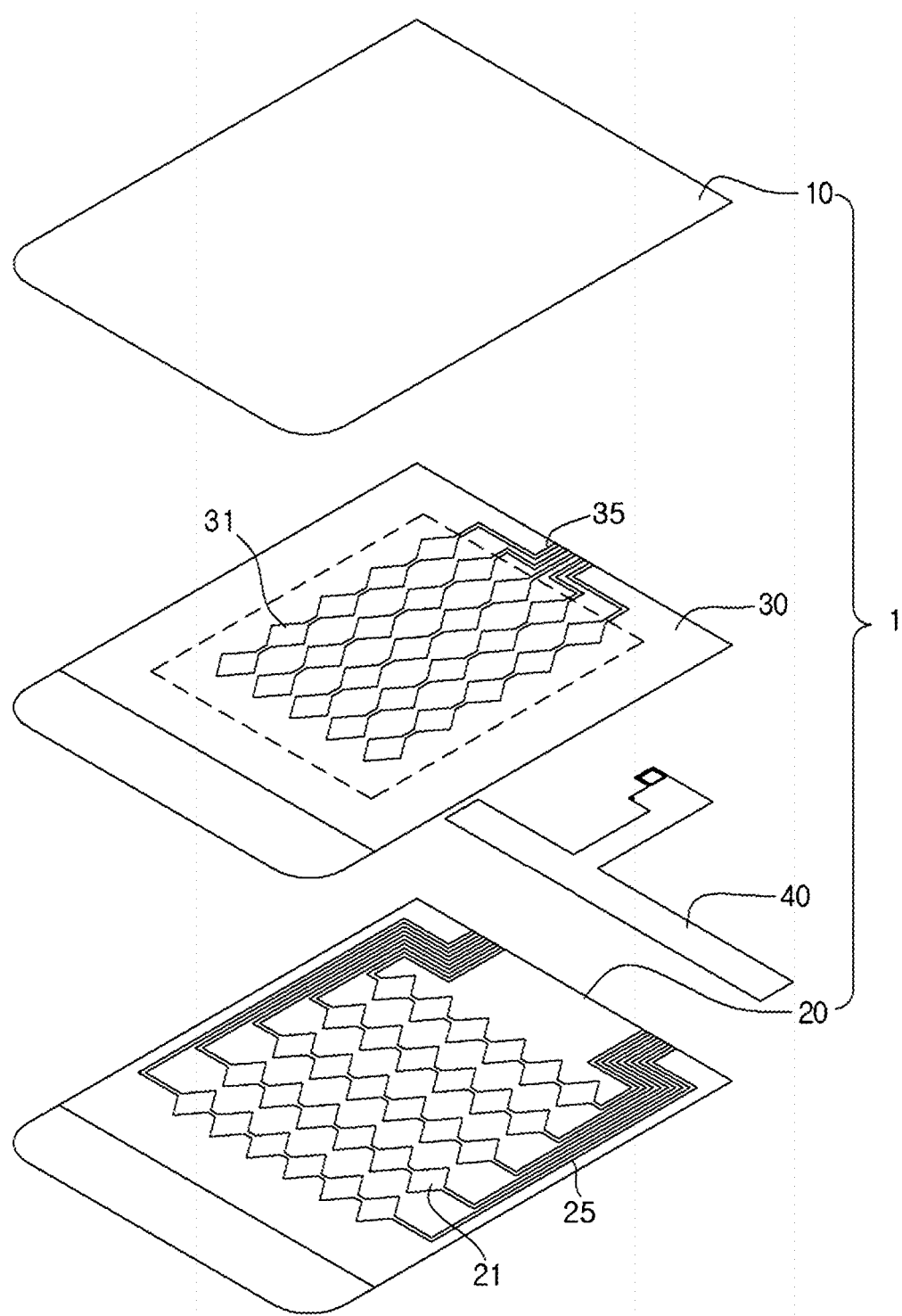
FIG. 2 is an exploded perspective view of a touch panel according to an embodiment.

FIG. 2 is an exploded perspective view of a touch panel according to an embodiment.

Referring to FIG. 2, a touch panel 1 according to an embodiment may include a cover substrate 10, a first substrate 20, a second substrate 30, and a printed circuit board 40.

The second substrate 30 is located below the cover substrate 10. The first substrate 20 is located below the second substrate 30.

The cover substrate 10 may be attached to the second substrate 30. The cover substrate 10 and the second substrate 30 may be adhered to each other using an adhesive substance such as an optical clear adhesive (OCA).

The first substrate 20 may be attached to the second substrate 30. The first substrate 20 and the second substrate 30 may be adhered to each other using an adhesive substance such as the OCA.

The cover substrate 10 may include glass or plastic. The cover substrate 10 may include tempered glass, semi-tempered glass, soda-lime glass, reinforced plastic, or soft plastic.

The first substrate 20 and the second substrate 30 may include plastic such as polyethylene terephthalate (PET).

Electrode patterns and wire patterns may be formed on the first substrate 20 and the second substrate 30.

A first electrode pattern 21 and a first wire pattern 25 may be formed on the first substrate 20. A second electrode pattern 31 and a second wire pattern 35 may be formed on the second substrate 30.

The first electrode pattern 21 may be formed in a first direction. The first electrode pattern 21 may be electrically connected to the first wire pattern 25.

The second electrode pattern 31 may be formed in a second direction. The second direction may cross the first direction. The second electrode pattern 31 may be formed in a direction crossing the first electrode pattern 21. The second electrode pattern 31 may be electrically connected to the second wire pattern 35.

The printed circuit board 40 may be attached to the first substrate 20 and the second substrate 30. The printed circuit board 40 may be attached to one side of each of the first substrate 20 and the second substrate 30. The printed circuit board 40 may be attached to the one side of each of the first substrate 20 and the second substrate 30 to be electrically connected to the first wire pattern 25 and the second wire pattern 35. An anisotropic conductive film (ACF) may be applied onto the one side of each of the first substrate 20 and the second substrate 30 attached to the printed circuit board 40. The printed circuit board 40 may apply a voltage to the first wire pattern 25 and the second wire pattern 35 through the ACF.

The printed circuit board 40 may be a flexible printed circuit board (FPCB). The printed circuit board 40 may include a controller which receives a sensing signal from the first and second electrode patterns 21 and 31 via the first and second wire patterns 25 and 35 and controls the sensing signal.

Figure 3:
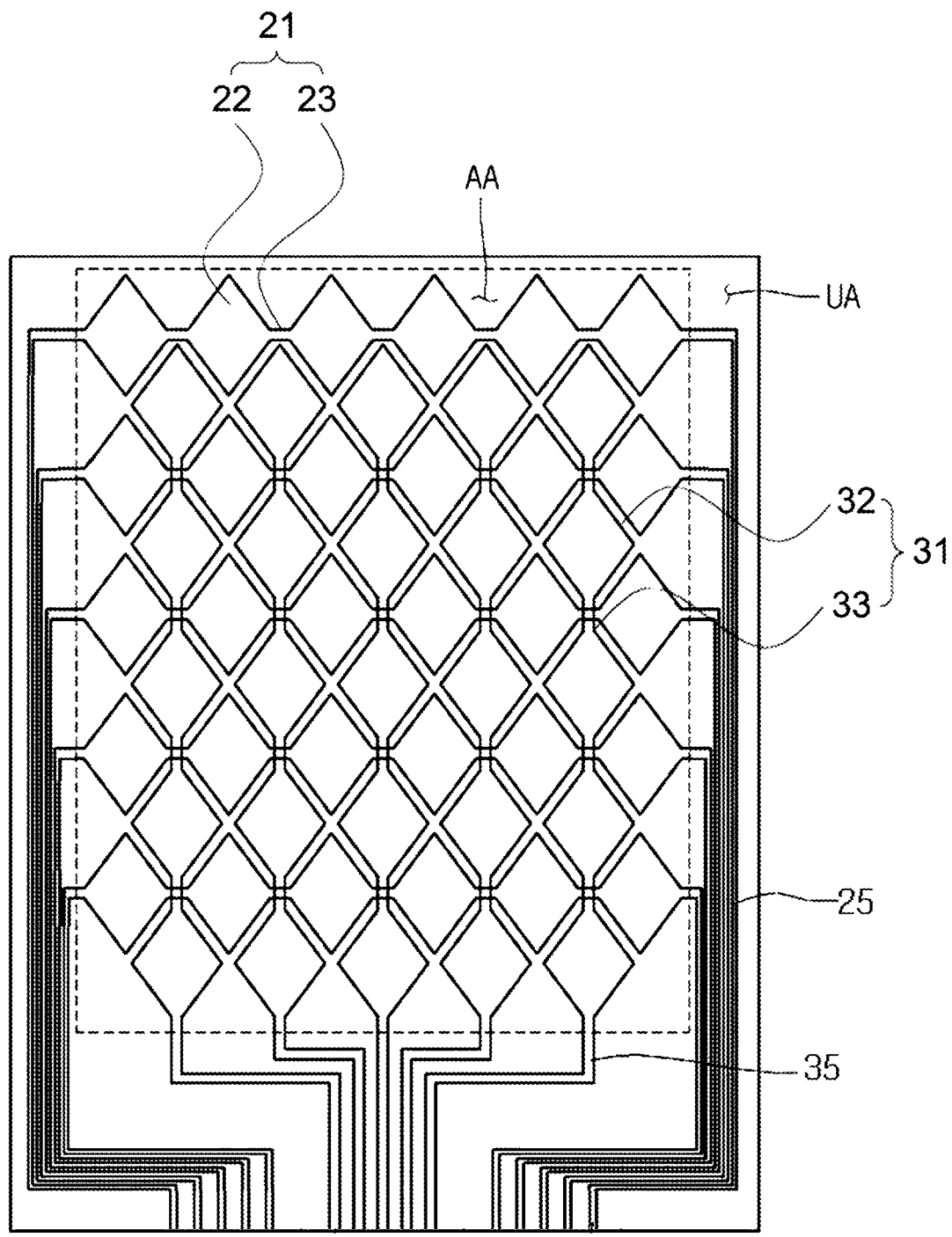
FIG. 3 is a top view of a touch panel according to an embodiment.

FIG. 3 is a top view of a touch panel according to an embodiment.

Referring to FIG. 3, the touch panel according to an embodiment may include an effective region AA and an ineffective region UA.

The effective region AA may be understood as a region to which a touch command may be input by a user. The ineffective region UA may be understood as a region which is located outside the effective region AA and to which a touch command is not input since this region is not activated even when it is touched by the user.

When the touch panel is used while being attached to a display panel, the effective region AA and the ineffective region UA of the touch panel may respectively correspond to a display region and a non-display region of the display device. An image is displayed in the display region. No image is displayed in the non-display region. Thus, the effective region AA of the touch panel may include a region which transmits light. The ineffective region UA of the touch panel may include a region which does not transmit light.

A plurality of electrode patterns may be formed in the effective region AA. A plurality of first electrode patterns 21 may be formed in the effective region AA of the first substrate 20. A plurality of second electrode patterns 31 may be formed in the effective region AA of the second substrate 30.

Each of the first electrode pattern 21 and the second electrode pattern 31 may include a plurality of body regions and a plurality of connection parts. The body regions may be arranged in one direction. The connection parts may connect adjacent body regions to each other.

The first electrode pattern 21 may include first body regions 22 and first connection parts 23. The first body regions 22 may be arranged in a first direction. The first connection parts 23 may connect first body regions 22 adjacent in the first direction to other. The first body regions 22 and the first connection parts 23 may be integrally formed.

The second electrode pattern 31 may include second body regions 32 and second connection parts 33. The second body regions 32 may be arranged in a second direction crossing the first direction. The second connection parts 33 may connect second body regions 32 adjacent in the second direction to each other. The second body regions 32 and the second connection parts 33 may be integrally formed.

Each of the first body regions 22 and the second body regions 32 may be defined as a unit conductive pattern. A touch pixel may include at least one among the unit conductive patterns.

The first connection parts 23 and the second connection parts 33 may be formed to intersect each other. The first connection parts 23 and the second connection parts 33 are formed on different substrates and are thus electrically open.

A plurality of wire patterns may be formed in the ineffective region UA. A plurality of first wire patterns 25 may be formed in the ineffective region UA of the first substrate 20. A plurality of second wire patterns 35 may be formed in the ineffective region UA of the second substrate 30.

The first electrode pattern 21 may be electrically connected to the first wire pattern 25. The first electrode pattern 21 may be integrally formed with the first wire pattern 25. Alternatively, the first electrode pattern 21 may be formed separately from the first wire pattern 25.

The second electrode pattern 31 may be electrically connected to the second wire pattern 35. The second electrode pattern 31 may be integrally formed with the second wire pattern 35. Alternatively, the second electrode pattern 31 may be formed separately from the second wire pattern 35.

The first and second electrode patterns 21 and 31 and the first and second wire patterns 25 and 35 may include a conductive material. The first and second electrode patterns 21 and 31 may be formed of a transparent conductive material.

Figure 4:
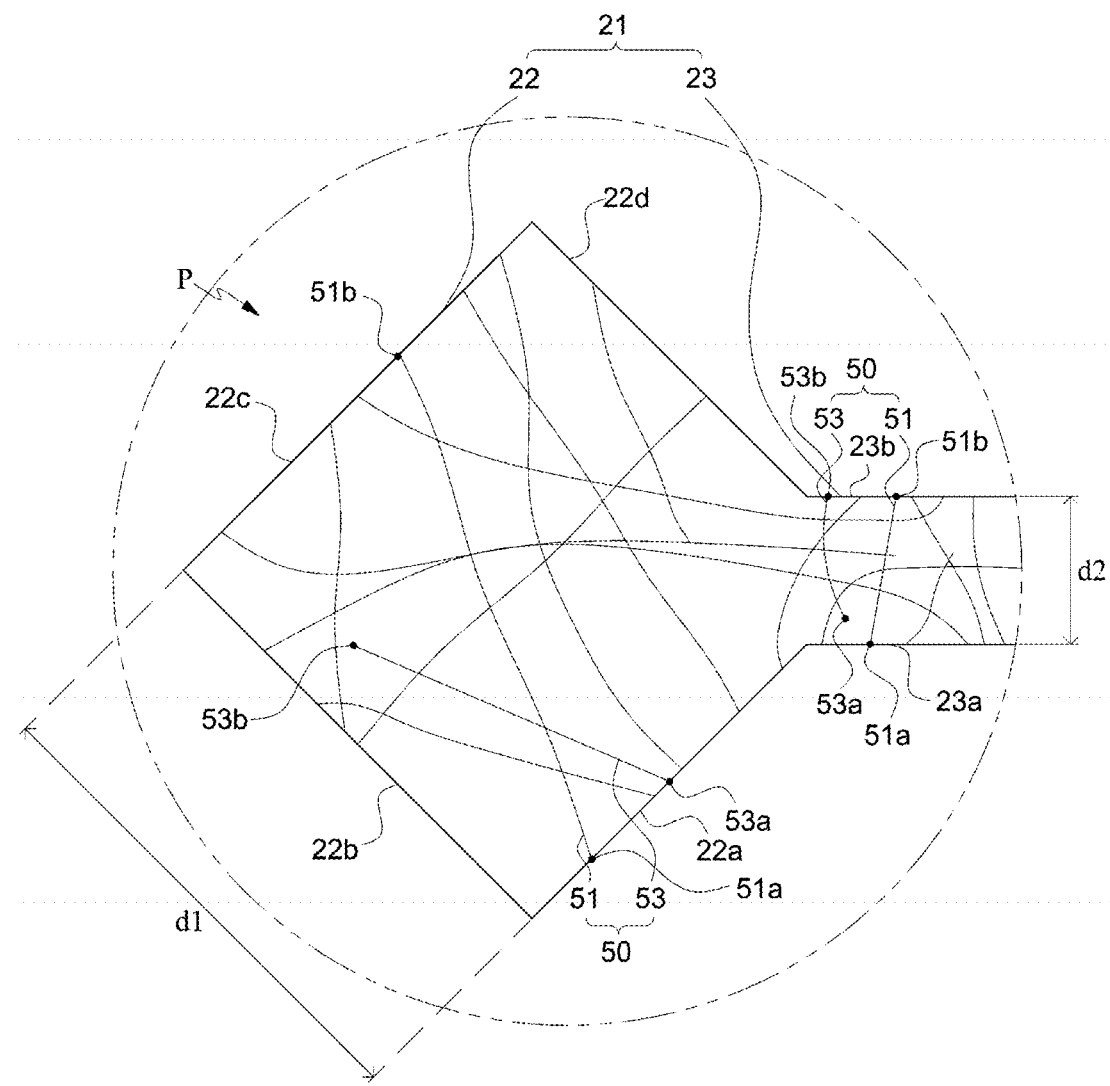
FIG. 4 is an enlarged view of a first electrode pattern according to an embodiment.
Figure 5:
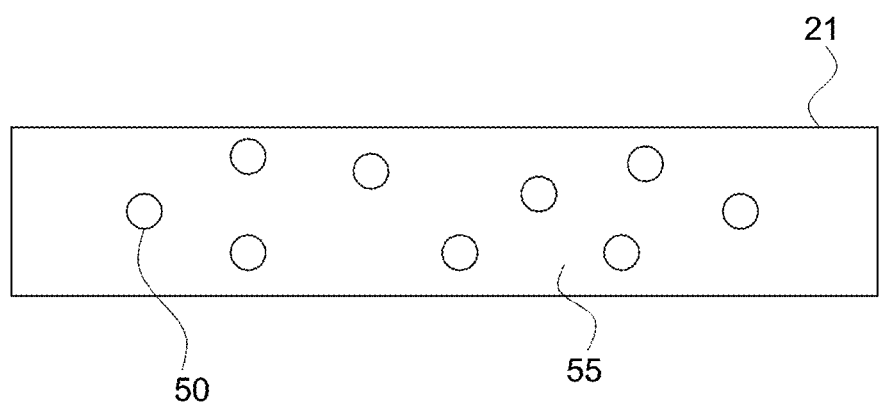
FIG. 5 is a side view of an electrode pattern according to an embodiment, when viewed at a point P.

FIG. 4 is an enlarged view of a first electrode pattern according to an embodiment. FIG. 5 is a side view of an electrode pattern according to an embodiment, when viewed at a point P.

Referring to FIGS. 4 and 5, the first electrode pattern 21 according to an embodiment may include a first body region 22 and a first connection part 23.

The first electrode pattern 21 may include a plurality of nanostructures 50 and a matrix 55.

The nanostructures 50 may be nanofibers having an aspect ratio of 100,000 or more. The nanostructures 50 may have a width of 1 um or less. The nanostructures 50 may be formed in a cylindrical shape.

The nanostructures 50 may include a metal material. Examples of the metal material may include silver, gold, copper, nickel, gold-plated silver, platinum, and palladium. When the nanostructures 50 include silver, the nanostructures 50 may be defined as silver nanostructures. Alternatively, the nanostructures 50 may be formed of only a metal material.

The nanostructures 50 are formed as having a small width and cannot be thus viewed with a naked eye. The first electrode pattern 21 including the nanostructures 50 is guaranteed having high optical transmissivity.

The matrix 55 is referred to as a solid-state material forming a main body of the first electrode pattern 21, in which the nanostructures 50 are dispersed or included therein.

The matrix 55 may protect the nanostructures 50 from the outside. The matrix 55 may prevent the nanostructures 50 from being oxidized. The matrix 55 may provide adhesive strength so that the first electrode pattern 21 may be attached to the first substrate 20.

The nanostructures 50 may be in direct contact with the matrix 55. That is, outer surfaces of the nanostructures 50 may be in direct contact with the matrix 55.

The matrix 55 may include a conductive polymer. When the matrix 55 includes the conductive polymer, the matrix 55 may provide a charge moving path. As the matrix 55 provides the charge moving path, the matrix 55 may serve as an auxiliary electrode.

The conductive polymer may include, but is not limited to, polyacetylene, polythiophene, polypyrrole, polyparaphenylene, polyparaphenylene vinylene, PEDOT:PSS, carbon nanotubes, or the like.

The first body region 22 may have a tetragonal shape. The first body region 22 may have four side surfaces. The first body region 22 may have a first side surface 22a, a second side surface 22b, a third side surface 22c, and a fourth side surface 22d. The first side surface 22a is defined as a surface facing the third side surface 22c. The second side surface 22b is defined as a surface facing the fourth side surface 22d. The second side surface 22b is a surface adjacent to the first side surface 22a and the third side surface 22c. The fourth side surface 22d is a surface adjacent to the first side surface 22a and the third side surface 22c.

The first to fourth side surfaces 22a to 22d may be cross sections patterned by a photolithographic process.

Similarly, the nanostructures 50 may have a cross section patterned by the photolithographic process. That is, the nanostructures 50 which pass the surfaces patterned by the photolithographic process may be also patterned and thus has cross sections. The patterned cross sections of the nanostructures 50 may be exposed to the outside of the matrix 55. The cross sections of the nanostructures 50 and the matrix 55 which are patterned by the photolithographic process are the same surfaces and one end of each of the nanostructures 50 is exposed by patterning to the outside of the matrix 55.

Opposite ends of some nanostructures 50 may intersect side surfaces of the first electrode pattern 21, and one of opposite ends of some nanostructures 50 may intersect a side surface of the first electrode pattern 21 and the other end thereof may be located inside the first electrode pattern 21. Furthermore, both opposite ends of each of the remaining nanostructures 50 may be located inside the first electrode pattern 21.

Nanostructures 50, opposite ends of which intersect side surfaces of the first electrode pattern 21 among the nanostructures 50 may be referred to as first nanostructures 51. The remaining nanostructures 50 except the first nanostructures 51 may be referred to as second nanostructures 53.

That is, nanostructures 50, at least one of opposite ends of which is located inside the first electrode pattern 21 among the nanostructures 50 may be defined as the second nanostructures 53. In other words, the second nanostructures 53 may include nanostructures, one of opposite ends of which intersects a side surface of the first electrode pattern 21 and the other end of which is located inside the first electrode pattern 21, and nanostructures, both opposite ends of which are located inside the first electrode pattern 21 among the plurality of nanostructures 50.

First, the first body region 22 will be described as an example. The first nanostructures 51 included in the first body region 22 may be defined as nanostructures, both opposite ends of which are in contact with edges of the first body region 22 among the plurality of nanostructure 50. Since the first body region 22 is defined as a unit conductive pattern, the first nanostructures 51 may be nanostructures, both opposite ends of which are in contact with edges of the unit conductive pattern among the plurality of nanostructures 50. Each of the first nanostructures 51 may include a first end 51a and a second end 51b. The first end 51a of the first nanostructure 51 may intersect the first side surface 22a of the first body region 22. The second end 51b of the first nanostructure 51 may intersect the third side surface 22c of the first body region 22. Although it is illustrated that opposite ends of the first nanostructure 51 intersect the first side surface 22a and the third side surface 22c facing each other, the opposite ends of the first nanostructure 51 may intersect two adjacent side surfaces of the first body region 22.

Although not shown, a straight line connecting the first end 51a and the second end 51b may intersect the first nanostructure 51. That is, when the straight line connecting the first end 51a and the second end 51b is drawn, the first nanostructure 51 may intersect the straight line at at least one point. The at least one point may be a point other than the first end 51a and the second end 51b.

Since the first nanostructure 51 may have an arbitrary curved shape, the first nanostructure 51 may have a region located between the first end 51a and the second end 51b and intersecting the straight line between the first end 51a and the second end 51b. The straight line between the first end 51a and the second end 51b may be a virtual line.

The second nanostructure 53 may include a first end 53a and a second end 53b. The first end 53a of the second nanostructure 53 may intersect the first side surface 22a of the first body region 22. The second end 53b of the second nanostructure 53 may be located inside the first body region 22.

A ratio of the first nanostructures 51 to all the nanostructures 50 may be 70% or more. A ratio of first nanostructures 51 to all nanostructures 50 formed in the first body region 22 may be 70% or more.

That the ratio of the first nanostructures 51 to all the nanostructures 50 is high may be understood to mean that the nanostructures 50 are formed to be long. Thus, the number of intersecting nanostructures 50 per unit number of nanostructures 50 may be increased by forming the nanostructures 50 to be long. As the number of intersecting nanostructures 50 per unit number of nanostructures 50 is increased, the number of charge moving paths between the nanostructures 50 increases and thus the conductivity of the first electrode pattern 21 may be improved.

When the ratio of the first nanostructures 51 to all the nanostructures 50 is less than 70%, the effect of improving the conductivity of the first electrode pattern 21 is low. Thus, the effect of improving the conductivity of the first electrode pattern 21 may be increased by setting the ratio of the first nanostructures 51 to all the nanostructures 50 in the first body region 22 to be 70% or more.

The first body region 22 may have a first width d1, and the first connection part 23 may have a second width d2. The first width d1 may be understood as the distance between opposite side surfaces of the first body region 22. That is, the first width d1 may be the distance between the first side surface 22a and the third side surface 22c of the first body region 22.

The first width d1 may be different from the second width d2. A ratio of the second width d2 to the first width d1 may be 50 to 60%. The first width d1 may be 50 um to 60 um, and the second width d2 may be 30 um.

The first connection part 23 may be formed in a tetragonal shape. Since the first connection part 23 connects two adjacent first body regions 22, the first connection part 23 may have two side surfaces. The first connection part 23 may have a first side surface 23a and a second side surface 23b which are not in contact with the first body region 22. The second width d2 may be defined as the distance between the first side surface 23a and the second side surface 23b.

Similarly, the first side surface 23a and the second side surface 23b of the first connection part 23 may be cross sections patterned by the photolithographic process.

The first connection part 23 may also include a first nanostructure 51 and a second nanostructure 53. A nanostructure, opposite ends of which intersect side surfaces of the first connection part 23 among the plurality of nanostructures 50 is defined as the first nanostructure 51 of the first connection part 23. That is, the first nanostructure 51 of the first connection part 23 may be defined as a nanostructure, both opposite ends of which are in contact with edges of the first connection part 23. A nanostructure, at least one end of which is located inside the first connection part 23 among the plurality of nanostructures 50 may be defined as the second nanostructure 53 of the first connection part 23.

In the drawings, a first end 51a of the first nanostructure 51 of the first connection part 23 may intersect the first side surface 23a of the first connection part 23, and a second end 51b of the first nanostructure 51 of the first connection part 23 may intersect the second side surface 23b of the first connection part 23.

The first end 53a of the second nanostructure 53 may be located inside the first connection part 23. The second end 53b of the second nanostructure 53 may intersect the second side surface 23b of the first connection part 23.

A ratio of first nanostructures 51 to all nanostructures 50 formed in the first connection part 23 may be different from that of the first nanostructures 51 to all the nanostructures 50 formed in the first body region 22.

The ratio of the first nanostructures 51 in the first connection part 23 may be greater than that of the first nanostructures 51 in the first body region 22. The ratio of the first nanostructures 51 in the first connection part 23 may be 80% or more.

The number of intersecting nanostructures 50 per unit number of nanostructures 50 may be increased by setting the ratio of the first nanostructures 51 in the first connection part 23 to be 80% or more. Thus, the number of charge moving paths between the nanostructures 50 may increase and as a result, the effect of improving the conductivity of the first electrode pattern 21 may be achieved.

By setting the ratio of the first nanostructures 51 in the first connection part 23 which has a relatively small width and in which cracks are thus likely to occur due to external shocks to be 80% or more, the nanostructures 50 may serve as a frame to reduce the occurrence of cracks. Even if cracks occur, nanostructures 50 formed in a region in which cracks occur may provide a charge moving path and thus an electrical disconnection error may be prevented from occurring.

Although FIGS. 4 and 5 have been described above with respect to the first electrode pattern 21, the second electrode pattern 31 may have the same technical characteristics as those of the first electrode pattern 21.

Although a case in which the first body region 22 and the second body region 32 have a tetragonal shape has been described in the above embodiment, the first body region 22 and the second body region 32 may have a polygonal shape, a circular shape, or an oval shape. That is, the unit conductive pattern may have a polygonal shape, a circular shape, or an oval shape. When the first body region 22 and the second body region 32 have the circular shape or the oval shape, the first nanostructure 51 may be defined as a nanostructure, both opposite ends of which are in contact with edges of the first body region 22 and the second body region 32.

Figure 6:
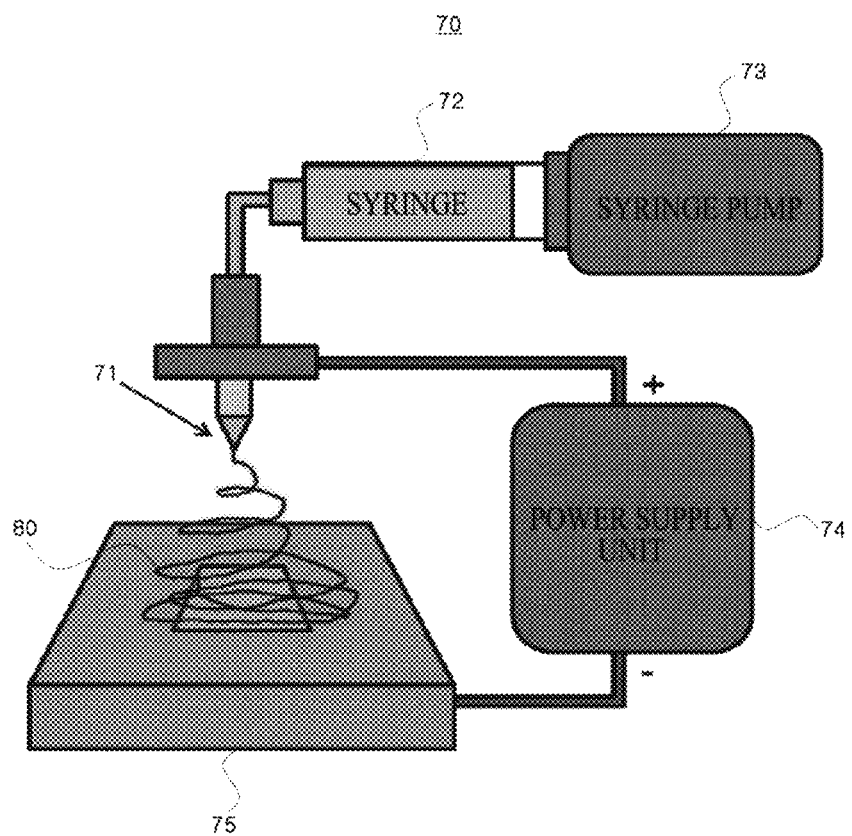
FIG. 6 is a diagram illustrating a field emission device according to an embodiment.

FIG. 6 is a diagram illustrating a field emission device according to an embodiment.

Referring to FIG. 6, a field emission device 70 according to an embodiment includes a nozzle 71, a syringe 72, a syringe pump 73, a power supply unit 74, and a collector 75.

The nozzle 71 may be connected to the syringe 72. The syringe 72 may be connected to the syringe pump 73. A spinning solution is injected into the syringe 72. The syringe pump 73 applies pressure to the syringe 72. The spinning solution injected into the syringe 72 may be transferred to the nozzle 71 due to the pressure applied by the syringe pump 73.

The spinning solution may include a metal material and a polymer.

The syringe pump 73 may adjust pressure to be applied to the syringe 72 to spray a constant amount of the spinning solution via the nozzle 71.

The power supply unit 74 may be electrically connected to the nozzle 71 and the collector 75, and apply a voltage to the nozzle 71 and the collector 75.

When the power supply unit 74 applies the voltage to the nozzle 71 and the collector 75, an electric field is formed between the nozzle 71 and the collector 75. When the intensity of the electric field is the same as a surface tension of the spinning solution, an end part of the nozzle 71 is covered with the spinning solution having electric charge.

In this case, when a voltage greater than or equal to the surface tension of the spinning solution is applied, nanofibers 80 are sprayed in a direction of the collector 75 which is a ground-voltage direction. The above method of forming the nanofibers 80 is referred to as electro-spinning.

Although electro-spinning has been described above as an example of a method of forming the nanofibers 80 in one embodiment, the present invention is not limited thereto.

The nanofibers 80 having a small width and a high aspect ratio may be formed by controlling, by the electro-spinning, a voltage to be applied by the power supply unit 74 and pressure to be applied by the syringe pump 73.

The nanofibers 80 formed by the electro-spinning may include the metal material and the polymer.

Thereafter, the nanostructures 50 including only the metal material of FIGS. 4 and 5 may be formed by removing the polymer from the nanofibers 80.

The optical transmissivity of an electrode pattern may be improved by forming the nanostructures 50 having a small width through the above process.

Furthermore, since the nanostructures 50 having a high aspect ratio, i.e., the nanostructures 50 which are long, may be formed, the number of intersecting nanostructures 50 per unit number of nanostructures 50 increases. As the number of intersecting nanostructures 50 per unit number of nanostructures 50 increases, the number of charge moving paths between the nanostructures 50 increases. Accordingly, the conductivity of an entire conductive pattern may be improved.

The polymer may be removed from the nanofibers 80 through heat treatment.

During the removing of the polymer from the nanofibers 80, intersecting nanostructures may be electrically connected to each other.

In one embodiment, since the effect of improving the conductivity of a conductive pattern may be achieved through the removing of the polymer, conductivity may be improved more easily than a process of processing an intersection region of silver nanowires having an organic film on surfaces thereof. Thus, manufacturing costs may be reduced. Furthermore, the removing of the polymer and the processing of the intersection region may be simultaneously performed through one process, thereby increasing manufacturing yield.

Figure 7:
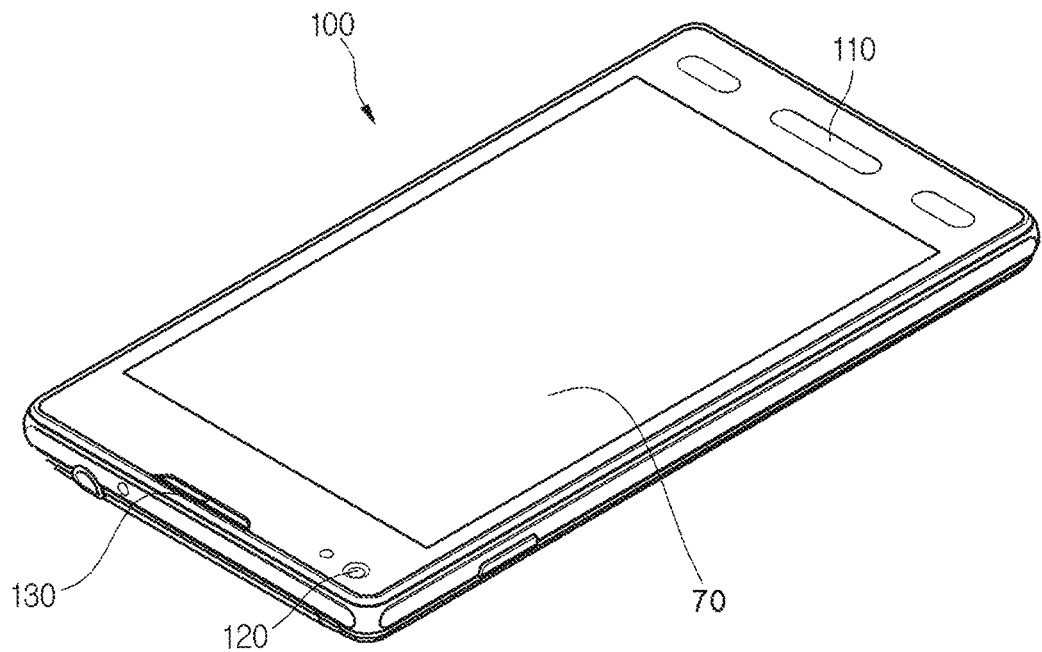
FIG. 7 is a perspective view of a display device to which a touch panel is applied, according to an embodiment.

FIG. 7 is a perspective view of a display device to which a touch panel is applied, according to an embodiment.

Referring to FIG. 7, a display device 100 may include an input button 110 to which a command is input from the outside, a camera 120 configured to capture still images and moving images, and a speaker 130 through which sound is output.

The display device 100 may include the touch panel 1 as described above and a display panel (not shown). The touch panel 1 may be formed on a front surface of the display panel and thus a cover glass 70 may be exposed on a top surface of the display device 100. Alternatively, the display panel may be attached to the touch panel 1.

The display panel may display an image. The display panel may be a liquid crystal display panel or an organic light-emitting display panel, and may be applied to various products such as a mobile phone, a television (TV), and a navigation device.

Although a display device has been described above as an example of a device to which touch panels according to embodiments of the present invention are applicable, the device is not limited to the display device and may be used in various products such as a keypad, a touch pad for a laptop computer, and a touch input device for a vehicle.

While the structure and features of the present invention have been described above with respect to embodiments of the present invention, it would be apparent to those of ordinary skill in the art that the present invention is not limited thereto and may be changed or modified variously without departing from the idea and scope of the present invention. Accordingly, it should be understood that such changes or modifications fall within the scope of the invention as defined in the appended claims.

The invention claimed is:

1. A conductive pattern including at least one unit conductive pattern comprising a touch pixel, the unit conductive pattern comprises:
   a plurality of nano structures having both ends, and
   a matrix containing the plurality of nano structures,
   wherein a first ratio of a number of the plurality of nano structures of the unit conductive pattern in which both ends are in contact with side surfaces of the unit conductive pattern to a total number of the plurality of nano structures of the unit conductive pattern is 70% or more,
   wherein a first end of at least one of the plurality of nano structures in contact with a first side surface of the unit conductive pattern is exposed to an outside of the matrix, a second end of the at least one of the plurality of nano structures in contact with a second side surface of the unit conductive pattern is exposed to an outside of the matrix, and the first side surface and the second side surface are adjacent to each other,
   wherein the at least one of the plurality of nano structures has a curved shape and intersects a virtual straight line between the first end and the second end at at least one point other than the first end and the second,
   wherein the conductive pattern further comprises a connection portion connecting adjacent unit conductive patterns and including a plurality of nano structures having both ends,
   wherein a second ratio of a number of the plurality of nano structures of the connection portion in which both ends are in contact with side surfaces of the connection portion to a total number of the plurality of nano structures of the connection portion is different from the first ratio, and
   wherein a width of the connection portion is 50% to 60% of a width of the unit conductive pattern.

2. The conductive pattern of claim 1, wherein the second ratio is 80% or more.

3. The conductive pattern of claim 1, wherein the plurality of nano structures of at least one of the unit conductive pattern or the connection portion comprises a silver (Ag) material.

4. The conductive pattern of claim 1, wherein the plurality of nano structures of at least one of the unit conductive pattern or the connection portion is formed by electro-spinning.

5. The conductive pattern of claim 1, wherein the matrix includes a conductive material.

6. The conductive pattern of claim 1, wherein the matrix prevents oxidation of the plurality of nano structures of the unit conductive pattern.

* * * * *